United States Patent
Pan et al.

(10) Patent No.: US 10,333,068 B2
(45) Date of Patent: Jun. 25, 2019

(54) WHITE LIGHT EMISSION

(71) Applicant: Merck Patent GmbH, Darmstadt (DE)

(72) Inventors: Junyou Pan, Frankfurt am Main (DE); Herwig Buchholz, Frankfurt am Main (DE); Ludvig Edman, Umeå (SE); Shi Tang, Umeå (SE)

(73) Assignee: Merck Patent GmbH, Darmstadt (DE)

( * ) Notice: Subject to any disclaimer, the term of this patent is extended or adjusted under 35 U.S.C. 154(b) by 280 days.

(21) Appl. No.: 15/129,909

(22) PCT Filed: Mar. 13, 2015

(86) PCT No.: PCT/EP2015/000561
§ 371 (c)(1),
(2) Date: Sep. 28, 2016

(87) PCT Pub. No.: WO2015/149911
PCT Pub. Date: Oct. 8, 2015

(65) Prior Publication Data
US 2017/0179392 A1   Jun. 22, 2017

(30) Foreign Application Priority Data
Mar. 31, 2014   (EP) ..................................... 14001199

(51) Int. Cl.
| | | |
|---|---|---|
| *C09K 11/02* | (2006.01) | |
| *C09K 11/06* | (2006.01) | |
| *H01L 51/00* | (2006.01) | |
| *H01L 51/50* | (2006.01) | |

(52) U.S. Cl.
CPC ........ *H01L 51/0035* (2013.01); *C09K 11/025* (2013.01); *C09K 11/06* (2013.01); *H01L 51/0037* (2013.01); *H01L 51/0043* (2013.01); *H01L 51/5036* (2013.01); *C09K 2211/1007* (2013.01); *C09K 2211/1014* (2013.01); *C09K 2211/1022* (2013.01); *C09K 2211/1044* (2013.01); *C09K 2211/1408* (2013.01); *C09K 2211/1416* (2013.01); *C09K 2211/1425* (2013.01); *C09K 2211/1433* (2013.01); *C09K 2211/185* (2013.01); *H01L 51/0039* (2013.01); *H01L 51/5016* (2013.01); *H01L 51/5032* (2013.01); *H01L 2251/308* (2013.01); *H01L 2251/5376* (2013.01); *Y02B 20/181* (2013.01)

(58) Field of Classification Search
CPC ............ H01L 51/0035; H01L 51/0039; H01L 51/5036; H01L 51/5024; H01L 51/5032; H01L 2251/5376; C09K 11/025; C09K 11/06; C09K 2211/185; C09K 2211/1416; C09K 2211/1425; C09K 2211/1433
See application file for complete search history.

(56) References Cited

U.S. PATENT DOCUMENTS

| | | | |
|---|---|---|---|
| 5,900,327 A | 5/1999 | Pei et al. | |
| 7,830,085 B2 * | 11/2010 | Gong ................. | H01L 51/5016 313/504 |
| 8,274,074 B2 | 9/2012 | Sekine et al. | |
| 2005/0073245 A1 | 4/2005 | Gong et al. | |
| 2010/0096978 A1 | 4/2010 | Wilson | |
| 2010/0283038 A1 | 11/2010 | Sekine et al. | |
| 2012/0245658 A1 | 9/2012 | Pan et al. | |

FOREIGN PATENT DOCUMENTS

| | | |
|---|---|---|
| EP | 1321112 A1 | 5/2008 |
| EP | 1921112 * | 5/2008 |
| JP | 2007070619 A | 3/2007 |
| JP | 2010118653 A | 5/2010 |

OTHER PUBLICATIONS

International Search Report for PCT/EP2015/000561 dated May 20, 2015.
Shi, H-F., et al., "Simple Conjugated Polymers with On-Chain Phosphorescent Iridium(III) Complexes: Toward Ratiometric Chemodosimeters for Detecting Trace Amounts Mercury(III)", Chemistry—A European Journal vol. 16, No. 40, (2010), pp. 12158-12167.

* cited by examiner

Primary Examiner — C Melissa Koslow
(74) Attorney, Agent, or Firm — Drinker Biddle & Reath LLP

(57) ABSTRACT

The present invention relates inter alia to compositions comprising conjugated polymers and a small molecule, devices comprising the composition and the application of the devices.

25 Claims, 1 Drawing Sheet

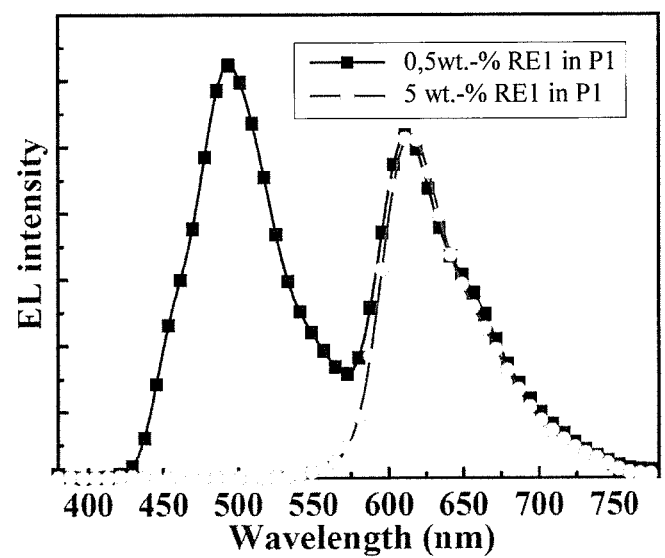

WHITE LIGHT EMISSION

CROSS-REFERENCE TO RELATED APPLICATIONS

This application is a national stage application (under 35 U.S.C. § 371) of PCT/EP2015/000561, filed Mar. 13, 2015, which claims benefit of European Application No. 14001199.0, filed Mar. 31, 2014, both of which are incorporated herein by reference in their entirety The present invention relates to compositions, formulations thereof, devices comprising the composition and the use of the devices.

BACKGROUND OF THE INVENTION

Commercial applications of white light emitting devices are manifold. White light emitting devices are not only used for lighting, but also in displays and as backlit. The requirements for modern white light emitting devices demand the development of new technologies. Displays in smartphones, tablet computers, TVs, and modern thin lighting devices, for instance, require thin and potentially flexible light sources with excellent performance characteristics. Thin electroluminescent organic light emitting devices, thus, represent an attractive target in order to accomplish specific requirements of new technologies. Particularly, organic light emitting diodes (OLEDs) and organic light emitting electrochemical cells (OLEC, LEC or LEEC) are considered as being promising electroluminescent devices.

Organic light emitting diodes (OLEDs), in which organic semiconductors are used as functional materials are disclosed, for example, in U.S. Pat. Nos. 4,539,507, 5,151,629, EP 0676461 and WO 98/27136. The organic light emitting materials being employed for this purpose are increasingly often organometallic complexes which exhibit phosphorescence instead of fluorescence (M. A. Baldo et al., Appl. Phys. Lett. 1999, 75, 4-6). For quantum-mechanical reasons, an up to four-fold increase in energy and power efficiency is possible using organometallic compounds as phosphorescent emitters. In accordance with the prior art, the triplet emitters in phosphorescent OLEDs are, in particular, iridium and platinum complexes, which are typically cyclometallated. The emitters currently available emit light in the range from blue to red.

The scientific and industrial interest in OLEDs is particularly high due to their potential commercial applications for lighting and display technologies. OLEDs exhibit several advantages over existing and established technologies such as low energy consumption, low thickness and high flexibility of the devices. Furthermore, OLEDs represent a uniform irradiation source as compared to the spotlight of other light sources such as inorganic LEDs.

The possibilities to achieve white light emission in OLEDs (WOLEDs) are manifold. Single-color white OLEDs comprise one emitter with a broad emission spectrum, but achieving the desired color coordinates might be difficult with this basic approach. Therefore, multi-color approaches have been developed. The multi-color approach can be realized in different ways. Firstly, the emissive layer (EML) of an OLED can be multiple doped. Secondly, different emissive layers in a single OLED can be used (sublayer-approach). Thirdly, red, green and blue light emitting subpixel can be used to white emission. Moreover, different OLEDs can be stacked in order to get WOLDs (tandem OLED). K. Meerholz et al. provide an overview on white OLEDs in Adv. Mater. 2011, 23, 233-248.

However, OLEDs also have some disadvantages. The preparation of OLEDs is often quite complex and costly, as OLEDs exhibit a multi-layered structure comprising a number of different functional layers such as substrate, anode, hole injection layer (HIL), hole transport layer (HTL), emissive layer (EML), electron transport layer (ETL), electron injection layer (EIL), cathode and potentially further layers.

Depending on the specific technical application a suitable alternative to an OLED is an organic light emitting electrochemical cell (OLEC, LEEC or LEC). The preparation of OLECs—particularly if curves or three-dimensional surfaces occur—is less complex as compared to the preparation of OLEDs. This is due to the fact that the requirements relating to homogeneity of the layer is less stringent. Thus, the production costs in particular for mass production are much lower as compared to the ones of OLEDs.

Furthermore, OLECs do not rely on air-sensitive charge-injection layers or metals such as Ba or Cs for electron injection, which further simplifies their preparation and makes them more cost efficient, as compared to OLEDs. This is due to the less stringent requirements for encapsulation of OLECs.

The underlying technology of OLECs differs from the one of OLEDs or LEDs. Both OLEDs and LEDs are diodes with forward bias and reverse bias. In contrast to OLECs the I-V (current-voltage) curves of both OLEDs and LEDs are asymmetric. They represent semiconductor technologies whereas an OLEC is basically an electrochemical or more precisely an electrolytic cell. Charge transport in OLEDs occurs via the movement of holes and electrons from molecule to molecule (hopping) until holes and electrons form so called excitons, i.e. electron-hole-pairs. Light is emitted when electrons and holes recombine. In OLECs, upon applying a voltage, the electroactive compound, being a conjugated polymer or a small molecule, is oxidized (p-type doped) at the anode and reduced (n-type doped) at the cathode.

The p- and n-type doping regions grow in size until they meet to form a so called p-n junction. Further, an exciton is formed on the organic emissive compounds in the p-n junction. The radiative decay of the exciton leads to the emission of light. The original work and the principle of OLECs have been published by Qibing Pei et al. in Science, 1995, 269, 1086-1088. OLECs show symmetric I-V curves, have low driving voltages, and there is no need for reactive metals as cathode.

But the time needed for forming p-n junction is long. Therefore, the turn-on is not instantaneous. In addition, lifetime of OLECs is often very short as compared to highly efficient OLEDs. Thus, up to date OLECs aren't suitable for, e.g., display applications, but many other applications are possible such as light emitting label for, e.g. packaging.

One way to achieve white light emission with OLEDs is to use a conjugated polymer as emissive material in polymer light emitting diodes (PLEDs) as disclosed in EP 1670844 B1. The white copolymer as disclosed in EP 1670844 B1 comprises blue, red and preferably also green emitters. In order to get a broad emission in OLEDs, one has to tailor the composition of the light emitting components of the polymer so that energy transfer from the blue light emitting component to the green one and further to the red one is only partially. As energy transfer in conjugated polymers is believed to occur via Förster energy transfer, the composition of green emitter and especially that of red emitter has to be very low, usually less than 0.05 mol % related to the total polymer, or even less. This results in several problems such as 1) the color is very sensitive to the concentration of red emitter. Small variations regarding the concentration can cause significant changes of the color and 2) a trace of the red emitter may also cause difficulties regarding reliability of the preparation of the polymer and 3) traces of red emitters might cause color shifts depending on the applied voltage. It is well accepted on the prior art, that high efficient light emission in organic electroluminescent devices can be attained by the use of phosphorescent emitters. For this reason the polymers as disclosed in EP 1670844 B1 comprise also phosphorescent metal complexes as repeating units. However, due to so called "long-range resonantly enhanced triplet formation" one skilled person will expect that a mixture or blend of a phosphorescent metal complex and a conjugated polymer will effectively quench the emission of the polymer. White emission of such systems is either not possible or of insufficient quality.

DESCRIPTION OF THE INVENTION

Indeed, white light emitting organic electroluminescent devices of the prior art suffer from either low performance or high complexity. WOLEDs with high efficiency, appropriate white emission and high color quality can be achieved with highly complex device architectures. Complex WOLED architectures, however, require complex and costly manufacturing processes. For industrial applications highly efficient white light emitting thin organic electroluminescent devices are needed that can easily be manufactured and that are suitable for mass production.

Object of the present invention is, therefore, to overcome the above-mentioned drawbacks of the prior art. Object of the present invention is to provide structurally simple thin organic electroluminescent devices that emit white light with high efficiency and high color purity. The devices should be of low complexity and suitable for mass production.

Surprisingly, it has been found that the composition disclosed below solve the technical problem. The composition can easily be manufactured based on well known standard materials that are employed as organic semiconducting materials. The composition allows the production of organic electroluminescent devices with a single layer as emissive layer. The devices show excellent performance data with respect to, driving voltage, lifetime, efficiency and color (e.g. CIE coordinates and CRI).

The present invention relates to a composition comprising a first conjugated polymer and at least one phosphorescent small molecule emitter, characterized in that the concentration of the phosphorescent small molecule emitter is below 4 wt.-% with respect to the total mass of the composition.

Preferably the phosphorescent small molecule emitter and the first conjugated polymer show photoluminescence at different peak wavelengths. Very preferably $\lambda_{phos}^{PL} > \lambda_{cP1}^{PL}$, wherein $\lambda_{phos}^{PL}$ and $\lambda_{cP1}^{PL}$ are the peak photoluminescent emission wavelengths of the phosphorescent small molecule emitter and the first conjugated polymer, respectively. Particularly preferably, the colors of the photoluminescent emission of the conjugated polymer and the phosphorescent small molecule emitter complement each other to generate white light.

The present invention further relates to a composition comprising at least a first conjugated polymer, a second conjugated polymer that differs from the first conjugated polymer and at least one phosphorescent small molecule emitter.

The first and the second polymer are conjugated polymers. For the purposes of the present invention, conjugated polymers are polymers which have mainly $sp^2$-hybridized (or sp-hybridized) carbon atoms, which may also be replaced by appropriate heteroatoms, in the main chain. In the simplest case, this means the alternating presence of double and single bonds in the main chain. "Mainly" means that naturally occurring defects which lead to interruptions of the conjugation do not invalidate the term "conjugated polymer". Furthermore, polymers having, for example, arylamine units, arylphosphine units and/or particular heterocycles (i.e. conjugation via N-, O- or S-atoms) are likewise referred to as conjugated in the present application. On the other hand, units such as simple (thio)ether bridges, alkylene bridges, esters, amides or imides in the main chain of the polymer would clearly be defined as nonconjugated segments.

In a preferred embodiment the main chain of the conjugated polymers comprise aromatic ring systems and/or heteroaromatic ring systems.

An aromatic ring system in the sense of the present invention contains 5 to 60 C atoms in the ring system. A heteroaromatic ring system in the sense of the present invention contains 2 to 60 C atoms and at least one heteroatom in the ring system, with the proviso that the sum of C atoms and heteroatoms is at least 5. The heteroatoms are preferably selected from Si, N, P, O, S and/or Se, particularly preferably selected from N, P, O and/or S. An aromatic or heteroaromatic ring system in the sense of the present invention is, in addition, intended to be taken to mean a system which does not necessarily contain only aryl or heteroaryl groups, but instead in which a plurality of aryl or heteroaryl groups may also be interrupted by a non-aromatic unit (preferably less than 10% of the atoms other than H), such as, for example, a C ($sp^3$-hybridised), N or O atom. Thus, for example, systems such as, for example, 9,9'-spirobifluorene, 9,9-diarylfluorene, triarylamine, diaryl ether and stilbene are also intended to be taken to be aromatic ring systems in the sense of the present invention, as are systems in which two or more aryl groups are interrupted, for example, by a linear or cyclic alkyl group or by a silyl group. P=O or C=O groups are usually not conjugation-interrupting.

An aromatic or heteroaromatic ring system having 5 to 60 ring atoms, which may also in each case be substituted by any desired radicals R and which may be linked to the aromatic or heteroaromatic ring system via any desired positions, is taken to mean, in particular, groups derived from benzene, naphthalene, anthracene, phenanthrene, pyrene, chrysene, perylene, fluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phen-anthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine, benzothiadiazole, benzanthrene, benzanthracene, rubicene and triphenylene.

Further preferred conjugated polymers that are also preferred in the context of the present invention are disclosed in WO 2010/149261 A1 (particularly compounds of formulae I, Ia to Ic, II, Ia to IIc, III, IIa to IIIg. IV, IVa and IVb, V, Va to Vh).

Very preferred conjugated polymers according to the present invention are polymers according to formula (I) or polymers according to formula (II) as disclosed in WO 02/077060 A1, particularly preferred are polymers according to formula (I) as disclosed in WO 02/077060 A1. Preferred embodiments of formulae (I) and (II) as disclosed in WO 02/077060 A1 also represent preferred embodiments according to the present invention.

Particularly preferred conjugated polymers according to the present invention are polymers according to formula (I) as disclosed in WO 03/020790 A2. Preferred embodiments of formula (I) as disclosed in WO 03/020790 A2 also represent preferred embodiments according to the present invention.

Thus, particularly preferred conjugated polymers according to the present invention are aromatic fluorenes and spiro compounds such as spirobifluorenes.

Another class of conjugated polymers that represent particularly preferred conjugated polymers according to the present invention is disclosed in formula (I) in WO 2005/014689 A2. The conjugated polymers according to formula (I) in WO 2005/014689 A2 contain dihydrophenanthrenes. Preferred embodiments of formula (I) as disclosed in WO 2005/014689 A2 also represent preferred embodiments according to the present invention.

Another class of conjugated polymers that represent particularly preferred conjugated polymers according to the present invention is selected from arylamines and heteroarylamines, such as disclosed in formulae (I) and (II) in WO 2013/156125 A1.

Yet another preferred class of conjugated polymers are represented by poly-arylenevinylenes (PPVs) such as the ones disclosed in formula (I) in WO 9823136 A1 and formula (I) in WO 99/24526 A1

As mentioned above the first and second conjugated polymers differ from each other. This means that both polymers differ either regarding their composition with respect to mol % of repeating units or with respect to the chemical structure of the repeating units.

The polymers may be linear, branched or dendritic.

The phosphorescent small molecule emitter is preferably selected from organic complexes of transition metals.

The term "small molecule" as used herein is defined as molecule not being a polymer, oligomer, dendrimer, or a blend. In particular, repeating structures are absent in small molecules. The molecular weight of small molecules is typically in the range of polymers with a low number of repeating units, oligomers or less. The molecular weight of the small molecule may be preferably below 4000 g/mol, particularly preferably below 3000 g/mol, and very particularly preferably below 2000 g/mol.

The polymers of embodiments preferably may have 10 to 10000, particularly preferably 20 to 5000 and very particularly preferably 50 to 2000 repeating units. Oligomers according to embodiments may have 2 to 9 repeating units. The branching index of the polymers and oligomers is between 0 (linear polymer without branching) and 1 (completely branched dendrimer). The term dendrimer as used herein is defined according to M. Fischer et al. in Angew. Chem., Int. Ed. 1999, 38, 885.

The molecular weight (MW) of the polymers of embodiments may preferably be in the range of about 10000 to about 2000000 g/mol, particularly preferably in the range of about 100000 to about 1500000 g/mol, and very particularly preferably in the range of about 200000 to about 1000000 g/mol. The determination of MW can be performed according to standard techniques known to the person skilled in the art by employing gel permeation chromatography (GPC) with polystyrene as internal standard, for instance.

A blend may be a mixture including at least one polymeric, dendrimeric, or oligomeric component.

The terms "fluorescent emitter", "fluorescent polymer", "fluorescence" or "fluorescent emission" as used herein refer to light emission or a polymer that emits light from an excited singlet state having a spin quantum number S=0. Thus, spin multiplicity (2S+1) is 1 (singlet). Due to quantum mechanical selection rules such electronic transitions are spin-allowed.

The terms "phosphorescent emitter", "phosphorescence" or "phosphorescent emission" as used herein refers to light emission or a material that emits light from an excited state having a spin quantum number S that is 1 or higher. Thus spin multiplicity (2S+1) is 3 (triplet) or higher (e.g. quintet). Due to quantum mechanical selection rules such electronic transitions are spin-forbidden. According to the definition of phosphorescence as provided herein the phosphorescent small molecule emitter can be selected from any emitter that is known to emit light from an excited state having a spin multiplicity that is higher than (2S+1)=1. Thus, particular emissions from excited triplet or quintet states are covered. Preferably, the terms refer to emission from a triplet state.

The emission colors of the conjugated polymers are defined in analogy to the definitions as disclosed in EP 1670844 B1.

Thus, the terms "blue", "blue light" and "blue emission" as used herein are defined as irradiation having a peak emission with a wavelength in the range between 380 to 490 nm, preferably in the range between 400 and 480 nm.

A blue emitting repeating unit B for the purposes of the present invention is defined as follows: a film of the homopolymer of this unit B displays luminescence and the maximum of the emission curve (peak emission) of a film of a polymer comprising 10 mol % of this unit B and 90 mol % of 2,7-[2'.3',6',7'-terta(2-methylbutyloxy)spirobifluoren]ylene is in a wavelength range from 380 to 490 nm, preferably in the range from 400 to 480 nm.

The terms "green", "green light" and "green emission" as used herein are defined as irradiation having a peak emission with a wavelength in the range between 490 and 540 nm, preferably the terms are used for irradiation with peak emission between 495 and 530 nm.

A green emitting repeating unit G for the purposes of the present invention is defined as follows: a film of the homopolymer of this unit G displays luminescence and the maximum of the emission curve (peak emission) of a film of a polymer comprising 10 mol % of this unit G and 90 mol % of 2,7-[2'.3',6',7'-terta(2-methylbutyloxy)spirobifluoren]ylene is in a wavelength range from 490 to 540 nm, preferably in the range from 495 to 530 nm. The terms "yellow", "yellow light" and "yellow emission" as used herein are defined as irradiation having a peak emission with a wavelength in the range between 540 and 590 nm, preferably the terms are used for irradiation with peak emission between 550 and 580 nm.

The terms "red", "red light" and "red emission" as used herein are defined as irradiation having a peak emission with a wavelength in the range between 590 to 780 nm, preferably in the range between 595 and 700 nm and particularly preferably in the range between 600 and 700 nm.

Light emitted by a material, composition or device can be characterized by parameters like CIE coordinates, color rendering indices (CRI) and correlated color temperature, or by spectrum specification, for example by specifying the relative emission intensities at desired wavelengths.

White light can be characterized by CIE coordinates, color rendering indices and correlated color temperature. In the study of the perception of color, different color spaces were defined, such as the first one CIE 1931 XYZ color space, and CIE 1960, CIE 1964, and CIE 1976 color spaces. In the present invention CIE 1931 will be used. In CIE 1931, the white is usually located in the center, for example (0.35, 0.34) @ 5200 K, depending on the correlated temperature.

The color rendering index (CRI) is a quantitative measure of the ability of a light source to reproduce the colors of various objects faithfully in comparison with an ideal or natural light source. The CRIs are calculated by comparing the color rendering of the test source to that of a "perfect" source (black body radiator) for sources with correlated color temperatures less than 5000 K, and a phase of daylight otherwise for example D65—a commonly-used standard illuminant defined by the International Commission on Illumination. Depending on the test color samples, different set of CRIs can be obtained. In the present invention, R1-R14 for the special color rendering indices using 14 CIE test color samples and the Ra for general color rendering index calculated from the first eight special color rendering indices will be used. More details on the definition, measurement and calculation methods on CIE coordinates, correlated color temperature, and CRIs could be referred to "CIE (1995), Method of Measuring and Specifying Color Rendering Properties of Light Sources, Publication 13.3, Vienna: Commission Internationale de l'Eclairage, ISBN 978-3900734572, http://www.cie.co.at/publ/abst/13-3-95.html (A verbatim re-publication of the 1974, second edition."

Given an emission spectrum, the color rendering index (CRI), CIE coordinates and correlated color temperature can be calculated using standard software well known to a person skilled in the art, e.g. by "CIE 13.3 Colour Rendering Index (1994)" by International Commission on Illumination, Copyright @ 1994 Peter Sylvester, University of Veszprem. One can get, CIE coordinates, Tc, special color rendering indices R1-R14 and the general colour rendering index Ra.

The terms "white", "white light" and "white emission" as used herein are defined as being irradiation that exhibits specific CIE values. White light as used herein exhibits a CIE (CIE 1931) value in the range between (0.2/0.2) to (0.45/0.48), preferably in the range between (0.25/0.25) and (0.4/0.47), very preferably in the range between (0.3; 0.3) and (0.4; 0.47) and particularly preferably in the range between (0.31; 0.31) and (0.4; 0.47).

Preferably the first and second conjugated polymers are fluorescent polymers. One skilled in the art is well aware of conjugated fluorescent polymers that can be used according to the present invention. The skilled person can select appropriate fluorescent repeating units and polymers from a large number of well known units or polymers.

Preference is given to a composition according to the present invention characterized in that $\lambda_{phos}^{PL} > \lambda_{cP2}^{PL}$, $\lambda_{phos}^{PL} > \lambda_{cP1}^{PL}$ and $\lambda_{cP1}^{PL} \neq \lambda_{cP2}^{PL}$ wherein $\lambda_{phos}^{PL}$, $\lambda_{cP2}^{PL}$ and $\lambda_{cP1}^{PL}$ are the peak photoluminescent emission wavelengths of the phosphorescent small molecule emitter, the second conjugated polymer and the first conjugated polymer, respectively.

The peak photoluminescent wavelengths of the conjugated polymers and of the phosphorescent small molecule emitter are determined according to standard techniques well known in the art. The peak photoluminescent wavelengths of the conjugated polymers are determined by recording the photoluminescence of a polymer film. The maximum of the emission curve represents the peak photoluminescent wavelengths.

The peak photoluminescent wavelength of the phosphorescent small molecule emitter is determined either by recording the photoluminescence of a film or of a solution of the small molecule. The small molecule is mixed with a matrix material such as polystyrene (PS) or polymethylmethacrylate (PMMA) according to standard techniques well known to one skilled person. One skilled person is also aware of the fact that the triplet level of the matrix material employed has to be higher than the triplet level of the small molecule.

Further preferred is, if the wavelengths $\lambda_{phos}^{PL}$ and $\lambda_{cP12}^{PL}$ represent complementary colors, wherein $\lambda_{cP12}^{PL}$ is defined by the peak photoluminescent emission wavelength of a composition of the first conjugated polymer and the second conjugated polymer.

Two different colors are said to be complementary colors if both colors complement each other to give white light, wherein white light is defined as disclosed below. In other words, the combined emission color of the first and second conjugated polymers complement the emission color of the phosphorescent small molecule emitter to generate white light.

Preference is given to a composition wherein the first conjugated polymer comprises blue-emitting repeating units B. Suitable units B are disclosed below.

Further preference is given to a composition according to the present invention characterized in that the first conjugated polymer comprises green-emitting repeating units G. The first conjugated polymer, thus, emits green light. The green emitting repeating units G comprise at least one aromatic or other conjugated structure and shift the emission color into green.

If the polymer contains green-emitting repeating units G, these are preferably units which comprise at least one aromatic or other conjugated structure and shift the emission color into the green. Preferred structures for green-emitting repeating units G are selected from the group consisting of electron-rich bisstyrylarylenes and derivatives of these structures. Without wishing to be tied to a particular theory, we presume that electron-pushing substituents generally lead to a green shift in the emission of these units. Further preferred green-emitting repeating units are selected from the group consisting of benzothiadiazoles and corresponding oxygen derivatives, quinoxalines, phenothiazines, phenoxazines, dihydrophenazines, bis(thienyl)arylenes, oligo(thienylenes) and phenazines. It is also permissible for a plurality of different green-emitting repeating units G to be used instead of one such repeating unit, in which case the total proportion of the green-emitting repeating units G is then not more than 3 mol %.

Particularly preferred structures which are suitable as green-emitting repeating units G are structures of the following formulae (G-I) to (G-XII), which may be substituted, for example by one or more organic groups having from 1 to 40 carbon atoms, or unsubstituted,

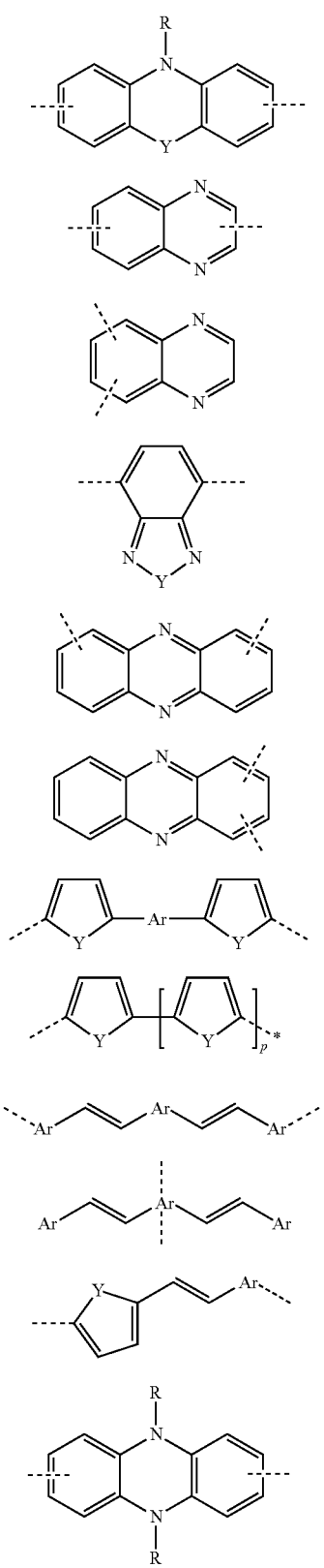

Formula (G-I)
Formula (G-II)
Formula (G-III)
Formula (G-IV)
Formula (G-V)
Formula (G-VI)
Formula (G-VII)
Formula (G-VIII)
Formula (G-IX)
Formula (G-X)
Formula (G-XI)
Formula (G-XII)

where the symbols and indices used have the following meanings: Y is identical or different on each occurrence and is in each case S or O; Ar is identical or different on each occurrence and is in each case an aromatic or heteroaromatic ring system which has from 3 to 30 carbon atoms and may be unsubstituted or substituted by fluorine or by one or more substituents R, OR or $NR_2$, preferably selected from the group consisting of phenyls, biphenyls, fluorenes, spirobifluorenes, thiophenes, furans or pyrroles, with the proviso that at least one unit Ar in the formulae (G-IX) and (G-X) is an electron-rich aromatic unit or is substituted by electron-rich substituents; this is preferably achieved by the unit being selected from among the structures of substituted or unsubstituted thiophenes, furans or pyrroles or by this unit being a phenyl group which is substituted by at least one alkoxy group, aryloxy group or substituted or unsubstituted amino group or a plurality of identical or different groups of this type;

R is identical or different on each occurrence and is in each case H, a linear, branched or cyclic alkyl chain which has from 1 to 22 carbon atoms and in which one or more nonadjacent carbon atoms may also be replaced by O, S, —CO—O— or —O—CO—O—, where one or more H atoms may also be replaced by fluorine, or a substituted or unsubstituted aryl group which has from 5 to 40 carbon atoms and in which one or more carbon atoms may also be replaced by O, S or N;

p is identical or different on each occurrence and is in each case 1, 2, 3, 4 or 5, preferably 1, 2 or 3;

and the broken-line bonds indicate the linkage in the polymer; they are in this case not a methyl group.

In another preferred embodiment the first conjugated polymer comprises blue emitting repeating units and the second conjugated polymer comprises green emitting repeating units.

The present invention further relates to a composition as disclosed, wherein the second conjugated polymer emits yellow light. One skilled in the art is well aware of yellow light emitting polymers and can select easily appropriate polymers from the prior art for the purpose of the present invention. Polyarylenevinylenes (PPVs) represent a prominent example of yellow light emitting conjugated polymers (WO 98/27136 A1, WO 99/24526 A1). Thus, preferably the second conjugated polymer is selected from polyarylenevinylenes, very preferably the conjugated polymers as disclosed in WO 98/27136 A1 and WO 99/24526 A1.

In a very preferred embodiment, the conjugated polymers are selected from arylamines, heteroarylamines, spirobifluorenes, fluorenes and polyarylvinylenes.

If the compositions according to the present invention are used in OLEDs, preferably the conjugated polymer of the present invention also comprise further repeating units which either display no fluorescence or which show fluorescence, wherein the peak photoluminescence of the conjugated polymer is still in the above-defined ranges.

The use of such repeating units can be useful, for example, to aid hole transport, hole injection, electron transport and/or electron injection. For the purposes of the present invention, such structural elements are as follows: if homopolymers or oligomers of these structural elements were produced, these would have, at least for one charge carrier, i.e. either for electrons or holes, a higher charge carrier mobility than is the case for a polymer which consists exclusively of structural elements described above. The charge carrier mobility (measured in $cm^2/(Vs)$) is preferably greater by a factor of at least 10, particularly preferably at least 50.

Repeating units which improve hole transport and/or hole injection are preferably selected from the group consisting of triarylamine derivatives, triarylphosphine derivatives, benzidine derivatives, tetraarylene-para-phenylenediamine derivatives, thianthrene derivatives, dibenzo-p-dioxin derivatives, phenoxathiin derivatives, carbazole derivatives, azulene derivatives, thiophene derivatives, pyrrole derivatives, furan derivatives and further O-, S- or N-containing heterocycles having a high HOMO (HOMO=highest occupied molecular orbital); these may each be substituted, for example by one or more organic groups having from 1 to 40 carbon atoms, or unsubstituted. These units preferably lead to a HOMO in the polymer of less than 5.8 eV (relative to vacuum), particularly preferably less than 5.5 eV.

Structural elements which improve electron transport and/or electron injection are preferably selected from the group consisting of pyridine derivatives, pyrimidine derivatives, pyridazine derivatives, pyrazine derivatives, triarylboranes, oxadiazole derivatives, quinoline derivatives, triazine derivatives and further O-, S- or N containing heterocycles having a low LUMO (LUMO=lowest unoccupied molecular orbital); these may be substituted, for example by one or more organic groups having from 1 to 40 carbon atoms, or unsubstituted. These units preferably lead to a LUMO in the polymer of greater than 2.7 eV (relative to vacuum), particularly preferably greater than 3.0 eV.

For the purpose of the present invention orbital energies such as the energy of the highest occupied molecular orbital (HOMO) or the lowest unoccupied molecular orbital (LUMO) or triplet and singlet energies are determined by quantum mechanical calculations. Different software packages can be used for this purpose such as "Gaussian03W" (Gaussian Inc.). For the purpose of the present invention Gaussian03W is used. For organic compounds without metal a geometry optimization is performed using the method "Ground State/Semi-empirical/Default Spin/AM1/Charge 0/Spin Singlet". Subsequently, the energy of the optimized compound is calculated by using the method "TD-SCF/DFT/Default Spin/B3PW91" with the basis set "6-31G(d)" (Charge 0, Spin Singlet). For organomentallic compounds geometry optimization is performed using the method "Ground State/Hartree-Fock/Default Spin/LanL2 MB/Charge 0/Spin Singlet". The subsequent energy calculation is in analogy to the one described above, with the exception that the basis set "LanL2DZ" is used for the metal and "6-31G(d)" is used as basis set for the ligands. As a result HOMO HEh and LUMO LEh are obtained in Hartree-units. The following equation allows the calculation of energies in eV. The equation is based on a calibration of HOMO and LUMO energies with cyclic voltammetry measurements (CV).

$$HOMO(eV)=((HEh*27.212)-0.9899)/1.1206$$

$$LUMO(eV)=((LEh*27.212)-2.0041)/1.385$$

These values are considered as HOMO or LUMO of the materials according to the present invention.

The polymers of the invention are generally prepared by polymerization of the monomers. The type of polymerization reaction is not critical. However, some types which will lead to formation of C—C bonds have been found to be particularly useful for conjugated polymers:

(A) polymerization by the SUZUKI method,
(B) polymerization by the YAMAMOTO method,
(C) polymerization by the STILLE method.

The way in which the polymerization can be carried out by means of these methods and the way in which the polymers can be separated off from the reaction medium and purified are described in detail in, for example, WO 2004/037887.

Very preferably the phosphorescent small molecule emitter is selected from emitters that emit light from triplet states. Particularly preferably, the phosphorescent small molecule emitter is selected from the group of organic metal complexes that emit from triplet states. Very particularly preferably, the phosphorescent small molecule emitter is selected from organic metal complexes comprising copper, ruthenium, rhodium, palladium, osmium, iridium or platinum as metal, particularly preferably from ruthenium, rhodium, palladium, osmium, iridium or platinum as metal and even more preferably, the phosphorescent small molecule emitter is selected from organic metal complexes comprising iridium or platinum and most preferably, the phosphorescent small molecule emitter is selected from organic metal complexes comprising iridium. Examples of phosphorescent small molecule emitters are disclosed below.

Preferably the concentration of the phosphorescent small molecule emitter is lower than 3 wt.-%, preferably less than 2 wt.-%, very preferably less than 1.5 wt.-%, particularly preferably less than 1.25 wt.-%, very particularly preferably less than 1.1 wt.-% and even more preferably less than 1 wt.-% with respect to the composition.

Particularly preferably the phosphorescent small molecule emitters has its peak photoluminescent emission peak in the range between 570 and 700 nm, very particularly preferably in the range between 580 and 700 nm and even more preferable in the range between 600 and 700 nm. The phosphorescent small molecule emitter is, therefore, preferably a red light emitting compound. The skilled person can easily select phosphorescent small molecule red light emitting emitters. It is well known in the art that organic metal complexes bearing, e.g., quinoline ligand, isoquinoline ligands or quinoxaline ligands often show red light.

Examples of preferred metal complexes bear isoquinoline ligands as disclosed in WO 2011/141120 A1.

Further red light emitting organic metal complexes are disclosed in EP 14000417.7, EP 14000105.8, EP 12005715.3, EP 13004552.9 and US 2014/0027733 A1 (e.g. pages 42 to 45).

Preferably, the phosphorescent small molecule emitter is selected from an organic metal complex of iridium or platinum, wherein iridium is particularly preferred.

If platinum is selected as metal ion of the organic complex then the ligand is preferably selected from porphyrins (e.g. Nature 395, 151, 1998) or bis-(pyridyl-phenyl)-amines (e.g. US 20070103060).

If iridium is selected as metal ion of the organic metal complex then at least one of the ligands of the complex is preferably selected from benzo-thiophen-pyridines (e.g. Appl. Phys. Lett 78, 1622, 2001), quinolines (e.g. US 2006835469, US 20060202194, US 20070087321, US 20080261076, US 20100090591), isoquinolines (e.g. WO 2011/141120 A1, US 2006835469, US 20070087321, Adv. Mater 19, 739, 2007, WO 2003/040257), quinoxalines, phenylpyrazines (e.g. WO 2009/100991), naphthyl-benztriazoles (e.g. WO 2008101842) and carbenes (e.g. U.S. Pat. No. 7,232,618).

Red light emitting rhenium complexes are also well known (e.g. US 2005/0144673) and are preferably used in compositions according to the present.

Red light emitting osmium complexes are also well known (e.g. Chem. Mater 17, 3532, 2005) and are preferably used in compositions according to the present.

Red light emitting ruthenium complexes are also well known (e.g. Adv. Mater 17, 1059, 2005) and are preferably used in compositions according to the present.

The metal complexes can be homoleptic or heteroleptic. In one embodiment homoleptic metal complexes are preferred. In another embodiment heteroleptic metal complexes are preferred. One skilled in the art can easily select appropriate further ligands of heteroleptic metal complexes. Typical further ligands of heteroleptic red light emitting metal complexes are, for example, selected from acetylacetonates.

Preference is given to a composition according to the present invention, wherein 490 nm$<\lambda_{cP12}^{PL}<$580 nm, preferably 495 nm$<\lambda_{cP12}^{PL}<$570 nm and very preferably 500 nm$<\lambda_{cP12}^{PL}<$560 nm.

Further preference is given to a composition according to the present invention, wherein 380 nm$<\lambda_{cP12}^{PL}<$550 nm, preferably 400 nm$<\lambda_{cP12}^{PL}<$530 nm and very preferably 450 nm$<\lambda_{cP12}^{PL}<$520 nm.

The CRI can be further improved if the composition according to the present invention further comprises at least one host material, wherein the host material is a conjugated polymer that differs from the first and second conjugated polymer. This host material is the third conjugated polymer of the composition. The third conjugated polymer can be selected from the conjugated polymers as disclosed above.

The at least one host material, i.e. the third conjugated polymer, is preferably also a fluorescent conjugated polymer that has its peak photoluminescent emission in the blue range. The host material is also called blue host.

Preferably the first, second and third conjugated polymer as well as the phosphorescent small molecule emitter of the composition fulfill the following conditions: $\lambda_{phos}^{PL}>\lambda_{cP2}^{PL}$, $\lambda_{phos}^{PL}>\lambda_{cP1}^{PL}$, $\lambda_{phos}^{PL}>\lambda_{cP3}^{PL}$, $\lambda_{cP1}^{PL}\neq\lambda_{cP2}^{PL}$, $\lambda_{cP1}^{PL}\neq\lambda_{cP3}^{PL}$ and $\lambda_{cP2}^{PL}\neq\lambda_{cP3}^{PL}$, wherein $\lambda_{phos}^{PL}$, $\lambda_{cP2}^{PL}$ and $\lambda_{cP1}^{PL}$ have the meaning as disclosed above and wherein $\lambda_{cP3}^{PL}$ is the peak photoluminescent emission wavelength of the third conjugated polymer.

If the composition comprises three different conjugated polymers then the wavelengths $\lambda_{phos}^{PL}$ and $\lambda_{cP123}^{PL}$ represent complementary colors, wherein $\lambda_{cP123}^{PL}$ is defined by the peak photoluminescent emission wavelength of a film consisting of a composition of the first, the second and the third conjugated polymer.

Preferably, the first conjugated polymer comprises blue emitting repeating units and the second conjugated polymer comprises green emitting repeating units and the third conjugated polymer comprises yellow emitting repeating units.

Very preferably, 450 nm$<\lambda_{cP123}^{PL}<$580 nm, preferably 460 nm$<\lambda_{cP123}^{PL}<$570 nm and very preferably 470 nm$<\lambda_{cP123}^{PL}<$560 nm.

The blue emitting conjugated polymer comprises repeating units B that are typically units which are generally used as polymer backbone or units which are used as blue emitters.

Blue-emitting repeating units B are typically units which are generally used as polymer backbone or units which are used as blue emitters. These are generally ones which comprise at least one aromatic or other conjugated structure but do not shift the emission color into the green or into the red. Preference is given to aromatic structures having from 4 to 40 carbon atoms, but also stilbene and tolane derivatives and certain bis(styryl)arylene derivatives. These are, for example, the following structural elements which may be substituted, for example by one or more groups having from 1 to 40 carbon atoms, or unsubstituted: 1,4-phenylene derivatives, 1,4-naphthylene derivatives, 1,4- or 9,10-anthracenylene derivatives, 2,7- or 3,6-phenanthrenylene derivatives, 4,4'-biphenylylene derivatives, 4,4''-terphenylylene derivatives, 4,4'-bi-1,1'-naphthylylene derivatives, 4,4'-stilbene derivatives, 4,5 dihydropyrene derivatives, 4,5,9,10-tetrahydropyrene derivatives, fluorene derivatives (e.g. as described in EP 0842208, WO 99/54385, WO 00/22027, WO 00/22026, WO 00/46321), spirobifluorene derivatives (e.g. as described in EP 0707020, EP 0894107, WO 03/020790, WO 02/077060), 5,7 dihydrodibenzoxepin derivatives, cis- and trans-indenofluorene derivatives (e.g. as described in WO 04/041901, EP 03014042.0) and 9,10 dihydrophenanthrene derivatives (e.g. as described in DE 10337346.2). Apart from these classes, ladder PPPs (=LP-PPs) or sections of such polymers (e.g. as described in WO 92/18552) and also PPPs containing ansa structures (e.g. as described in EP 690086), for example, are also possible here. Bis(Styryl)arylene derivatives which are not electron-rich can also be used for this purpose. It can also be preferred to use a plurality of different blue-emitting repeating units B of this type instead of one such unit in a polymer.

Without being bound to any specific theory it is believed that the energy in the compositions according to the present invention is transferred via Förster energy transfer from the third to the first and to the second conjugated polymer. There is one broad emission observed from the polymers that complement the red emission of the phosphorescent small molecule emitter to result in white light of high quality.

The compositions according to the present invention can be employed in different organic electroluminescent devices in order to achieve the desired result. However, particular preference is given to the application in organic light emitting diodes (OLEDs) and organic light emitting electrochemical cells (OLECs, LECs, LEECs).

Surprisingly, white light of particular high quality in OLECs can be achieved with compositions according to the present invention if another component is present in the composition. Thus, the composition further comprises an electrolyte. Hereby, any electrolyte that is typically used in OLECs can be used in the compositions according to the present invention. One skilled person can select appropriate electrolytes from a large number of well known electrolytes.

Preferably the electrolyte is selected from the materials disclosed in WO 2011/069590 A1, wherein the materials disclosed on page 38. Line 8 to page 45, line 5 represent particularly preferred materials in the context of the present invention.

Further preferred electrolytes are selected from hydroxyl-endcapped trimethylolpropane ethoxylate (TMPE) (J. Phys. Chem. Lett, 2010, 1, 2727-2732), LiCF$_3$SO$_3$ (Appl. Phys. Lett., 100, 193508, 2012) and polyethylene oxide electrolytes, such as PEO-LiX electrolytes (e.g. Macromolecules 2007, 40, 4963-4971), wherein LiX represent lithium salts with X being an anion such as CF$_3$SO$_3^{2-}$ and SO$_4^{2-}$.

Preferably, the composition comprises the electrolyte in a concentration range between 0.1 wt.-% and 30 wt.-%, very preferably in the range between 0.5 wt.-% and 10 wt.-%, particularly preferably in the range between 1 wt.-% and 5 wt.-% and very particularly preferably in the range between 2 wt.-% and 4 wt.-% with respect to the total mass of the composition.

The compositions according to the present invention can be used in organic electroluminescent devices. Basically, there are two different techniques for the preparation of organic electroluminescent devices. Firstly, the devices can be prepared by using printing techniques or spin coating techniques, i.e. preparation from liquid phase or solution. Secondly, the devices can be prepared by employing vacuum deposition techniques. As the organic electroluminescent devices exhibit a multi-layered structure often some layers are coated from solution and others may be deposited by vacuum techniques. If the devices or specific layers are prepared from solution, formulations are required. The formulations can be solutions, dispersions and emulsions.

The formulation employed for this purpose comprise, beside the composition according to the present invention, at least one solvent and optionally one or more further components such as additives.

Thus the present invention also relates to a formulation comprising at least one composition according to the present invention and at least one solvent. The solvent can be any solvent known to one skilled in the art. The solvents are organic solvents typically used for polymers and small organic molecules.

Preferably, the solvents used are selected from the group consisting of aromatic hydrocarbons, like toluene, o-, m- or p-xylene, trimethyl benzenes (e.g. 1,2,3-, 1,2,4- and 1,3,5-trimethyl benzenes), phenoxytoluene, tetralin, other mono-, di-, tri- and tetraalkylbenzenes (e.g. diethylbenzenes, methylcumene, tetramethylbenzenes etc), aromatic ethers (e.g. anisole, alkyl anisoles, e.g. 2, 3 and 4 isomers of methylanisole, 2,3-, 2,4-, 2,5-, 2,6-, 3,4- and 3,5-isomers of dimethylanisole), naphthalene derivatives, alkylnaphthalene derivatives (e.g. 1- and 2-methylnaphtha-lene), di- and tetrahydronaphthalene derivatives. Also preferred are aromatic esters (e.g alkyl benzoates), aromatic ketones (e.g. acetophenone, propiophenone), alkyl ketones (e.g. cyclohexanone), heteroaromatic solvents (e.g. thiophene, mono-, di- and trialkyl thiophenes, 2-alkylthiazoles, benzthiazoles etc, pyridines), halogenarylenes and anilin derivatives. These solvents may comprise halogen atoms.

Very preferably are: 3-fluoro-trifluoromethylbenzene, trifluoromethylbenzene, dioxane, trifluoromethoxybenzene, 4-fluoro-benzenetrifluoride, 3-fluoropyridine, toluene, 2-fluorotoluene, 2-fluoro-benzenetrifluoride, 3-fluorotoluene, pyridine, 4-fluorotoluene, 2,5-difluorotoluene, 1-chloro-2,4-difluorobenzene, 2-fluoropyridine, 3-chlorofluorobenzene, 1-chloro-2,5-difluorobenzene, 4-chlorofluorobenzene, chlorobenzene, 2-chlorofluorobenzene, p-xylene, m-xylene, o-xylene, 2,6-lutidine, 2-fluoro-m-xylene, 3-fluoro-o-xylene, 2-chlorobenzenetrifluoride, dimethylformamide, 2-chloro-6-fluorotoluene, 2-fluoroanisole, anisole, 2,3-dimethylpyrazine, bromobenzene, 4-fluoroanisole, 3-fluoroanisole, 3-trifluoromethylanisole, 2-methylanisole, phenetol, benzenedioxol, 4-methylanisole, 3-methylanisole, 4-fluoro-3-methylanisole, 1,2-dichloro-benzene, 2-fluorobenzenenitril, 4-fluoroveratrol, 2,6-dimethylanisole, aniline, 3-fluorobenzenenitril, 2,5-dimethylanisole, 3,4-dimethylanisole, 2,4-dimethylanisole, benzenenitril, 3,5-dimethylanisole, N,N-dimethylaniline, 1-fluoro-3,5-dimethoxybenzene, phenylacetate, N-methylaniline, methylbenzoate, N-methylpyrrolidone, morpholine, 1,2-dihydronaphthalene, 1,2,3,4-tetrahydronaphthalene, o-tolunitril, veratrol, ethylbenzoate, N,N-diethylaniline, propylbenzoate, 1-methylnaph-thalene, butylbenzoate, 2-methylbiphenyl, 2-phenylpyridin or 2,2'-Bitolyl.

More preferred are aromatic hydrocarbons especially toluene, dimethyl-benzenes (xylenes), trimethyl benzenes, tetralin and methylnaphthalenes, aromatic ethers, especially anisole and aromatic esters, especially methyl benzoate.

Most preferred are aromatic ethers, especially anisole and derivates thereof, such as alkyl anisoles, and aromatic esters, especially methylbenzoate.

These solvents can be used as mixture of two, three or more solvents.

The present invention also relates to the use of a composition according to the present invention in an organic light electroluminescent device.

Preferably the organic electroluminescent device is selected from organic light emitting transistors (OLETs), organic field quenching devices (OFQDs), organic light emitting electrochemical cells (OLECs, LECs, LEECs), organic laser diodes (O-Laser) and organic light emitting diodes (OLEDs), very preferably OLECs and OLEDs, particularly preferably OLECs.

The present invention also relates to the use of the compositions or devices according to the present inventions to facilitate white light emission in organic electroluminescent devices.

The present invention also relates to a method for the generation of white light by using the compositions according to the present invention in organic electroluminescent devices.

The present invention further relates to an organic electroluminescent device comprising at least one composition according to the present invention. Preferred electroluminescent devices are disclosed above.

Preferably the organic electroluminescent device is an OLED.

The structure of an OLED is well known to one skilled person. Typical OLEDs and materials employed therein are disclosed, for example, in WO 2008/006459, U.S. Pat. Nos. 4,539,507, 5,151,629, EP 0676461 and WO 98/27136. Typically, an OLED comprises a multilayered structure comprising at least an anode, an emissive layer and a cathode. Efficient OLEDs comprise one or more additional layers selected from, for example, a hole injection layer, a hole transport layer, an electron transport layer, an electron injection layer, hole blocking layer, electron blocking layer and exciton blocking layer. However, the layered structure of efficient small molecule OLEDs (SMOLEDs) is, in most cases, more complex as compared to the structure of polymeric OLEDs (PLEDs). However, even PLEDs often comprise additional layer such as interlayer, buffer layer or one of the aforementioned layer. Actually, one skilled in the art is well aware of the differences between the PLEDs and SMOLEDs and has no difficulty to select appropriate materials and preparation methods (J. Shinar, Organic Light Emitting Devices, AIP Press, 2004; Z. Li et al Organic light emitting materials and devices, CRC Press, 2007) in order to build an organic electroluminescent device that can be used according to the present invention.

In a particularly preferred embodiment the present invention relates to OLECs comprising at least one composition as disclosed herein.

Preferred materials for the electrodes used in OLECs are selected from metals, particularly preferably selected from Al, Cu, Au, Ag, Mg, Fe, Co, Ni, Mn, Zn, Cr, V, Pd, Pt Ga, In and their alloys, conductive oxide, for example ITO, AZO, ZnO, and conductive organic thin films comprising such as poly(ethylenedioxythiophene)-polystyrene sulfonate (PEDOT:PSSH), Polyaniline (PANI). Further suitable conducting polymers could be found for example in the reviews edited by Michael S. Freund & Bhavana Deore, in "Self-Doped Conducting Polymers", John Willey & Sons, Ltd., 2007.

Preferably, the OLECs are prepared on a flexible substrate. The suitable substrate is preferably selected from films or foils based on polymers or plastics. The main selection criteria for polymers or plastics are 1) hygienic property and 2) glass transition temperature. The glass temperature ($T_g$) of the polymers can be found in a common handbooks, e.g. in "Polymer Handbook", Eds. J. Brandrup, E. H. Immergut, and E. A. Grulke, John Willey & Sons, Inc., 1999, VI/193-VI/276. Preferably, the $T_g$ of the polymer is above 100° C., particularly preferably above 150° C., and very particularly preferably above 180° C. Very preferred substrates are for example, poly(ethylene terephthalate) (PET) and poly(ethylene 2,6-naphthalate) (PEN).

To avoid degradations caused by oxygen and moisture, and also to prevent active materials in the devices, for example the ionic compounds and the organic electroluminescent compounds an appropriate encapsulation for the said device is necessary.

There are many technologies suitable for encapsulation of the devices according to the present invent. In general, all encapsulation techniques, which are developed for organic light emitting diodes (OLEDs), organic solar cells, organic dye-sensitized solar cells, organic field-effect transistor (OFETs), thin film batteries, microelectromechanical systems (MEMS) and electronic papers, can be applied in order to encapsulate the devices according to the present invention.

In a preferred embodiment, the device of the present invention is encapsulated using a thin film encapsulation. Typically, a thin film encapsulation consists of alternating layers of an inorganic/organic stack, wherein inorganic layers are used to achieve adequate barrier performance and organic layers to eliminate inevitable defects of the inorganic layers. The materials used for inorganic layers can be selected from metals, metal oxides or mixed oxides, for example Ag, $SiO_x$, $SiN_x$, $AlO_x$, $ZrO_x$, $ZnO_x$, $HfO_x$, $TiO_x$ and indium tin oxide and so on. Some examples are alternating multilayers of vacuum-deposited acrylate polymers/$AlO_x$ as reported by Graff, G. L. et al. (J. Appl. Phys. 2004, 96, 1840), $Al_2O_3$/polyurea layers as reported by Young Gu Lee et al. (Org. Electron. 2009, 10, 1352 and in Dig. Tech. Pap.-Soc. Inf. Disp. Int. Symp. 2008, 39, 2011), SiON/$SiO_2$/parylene on PET substrate as reported by Han, Jin Woo, et al. (Jpn. J. Appl. Phys., Part 1 2006, 45, 9203), and poly-acrylate (20 μm)-Ag (200 nm) as reported by Wang, Li Duo et al. (Chin. Phys. Lett. 2005, 22, 2684).

By using advanced deposition techniques, for example atomic layer deposition (ALD), plasma assisted pulsed laser deposition (PAPLD) and plasma enhanced chemical vapor deposition (PECVD), the defects in inorganic layer can be significantly reduced so that all inorganic layers can be used, for example $Al_2O_3$/$HfO_2$ nanolaminated films by ALD as reported by Chang, Chih Yu et al. (Org. Electron. 2009, 10, 1300), and SiNx/SiOx layers as reported by Li, C. Y. et al. (IEEE Electron. Compon. Technol. Conf. 2008, 58$^{th}$, 1819), (PECVD SiO)/poly-benzo-oxazole (PBO) by Shimooka, Y. et al. (IEEE Electron. Compon. Technol. Conf. 2008, 58$^{th}$, 824), nanolaminated alternating layers of $Al_2O_3$/$ZrO_2$ by Meyer, J. et al. (Appl. Phys. Lett. 2009, 94, 233305/1), and nanolaminates of $Al_2O_3$/$ZrO_2$ by PAPLD as reported by Gorrn, Patrick et al. (J. Phys. Chem. 2009, 113, 11126), and SiC layers by PECVD as reported by Weidner, W. K. et al. (Annu. Tech. Conf. Proc—Soc. Vac. Coaters 2005, 48$^{th}$, 158), multilayer stack of silicon nitride-silicon oxide-silicon nitride silicon oxide-silicon nitride (NONON) by PECVD as reported by Lifka, H., et al. (Dig. Tech. Pap.-Soc. Inf. Disp. Int. Symp. 2004, 35, 1384), and polyethersulfon (PES)/ALD $AlO_x$ as reported by Park, Sang-Hee Ko, et al. (ETRI Journal 2005, 545). A review on thin film encapsulation by CVD and ALD is provided by Stoldt, Conrad R, et al. (J. Phys. D: Appl. Phys. 2006, 39, 163).

Further single layer encapsulation was also developed. Examples of single layer barrier layers are a perfluorinated polymer (Cytop), which can be easily spin-coated on OLEDs, as reported by Granstrom, J. et al. (Appl. Phys. Lett. 2008, 93, 193304/1), and single layer consisting of aluminum oxynitride ($AlO_xN_y$) by using a reactive radio frequency (RF) magnetron sputtering as reported by Huang, L. T. et al. (Thin Solif Films 2009, 517, 4207), single poly-SiGe layer by PECVD as reported by Rusu, Cristina et al. (J. Microelectromech. Syst. 2003, 12, 816).

Further details on materials and methods for encapsulation are disclosed, e.g., in WO 2009/089417, WO 2009/089417, WO 2009/042154, WO 2009/042052, US 2009/081356, US 2009/079328, WO 2008/140313, WO 2008/012460, EP 1868256, KR 2006/084743, KR 2005/023685, US 2005/179379, US 2005/023974, KR 2003/089749, US 2004/170927, US 2004/024105, WO 2003/070625, and WO 2001/082390.

In another preferred embodiment, the device of the present invention is encapsulated by using a curable resin together with a cap, wherein the cap covers at least the light emitting area, and the curable resin is applied between the substrate and the cap. The cap materials can be selected from metals and plastics in form of a plate or foil, and glass cap. Preferably, the cap is flexible, which is preferably selected from metal foils, plastic foils or metallised plastic foils. The metal can be selected from Al, Cu, Fe, Ag, Au Ni, whereby Al is particularly preferred. The selection criteria for plastics are 1) hygienic aspects 2) the glass transition temperature ($T_g$), which is supposed to be high enough. $T_g$ of polymers can be found in a suitable handbook, for example in "Polymer Handbook", Eds. J. Brandrup, E. H. Immergut, and E. A. Grulke, John Willey & Sons, Inc., 1999, VI/193-VI/276. Preferably, the polymer suitable for cap material has a $T_g$ above 60° C., preferably above 70° C., particularly preferably above 100° C., and very particularly preferably above 120° C. The cap used in the present invention is poly (ethylene 2,6-naphthalate) (PEN).

The suitable resin can be thermally cured or UV-curable. Preferably, the resin is UV-curable, optionally supported or facilitated by heating. A typical resin is the epoxy-based resin, which is commercially available at for example Nagase & Co., LTD. and DELO Industrie Klebstoffe. The resin can be applied on full-area of the emitting area or just on the edge, where no light emitting area is underneath.

Preferred electrode materials can selected from all metals, preferably Al, Cu, Au, Ag, Mg, Fe, Co, Ni, Mn, Zn, Cr, V, Pd, Pt and their alloys, conductive oxide, for example ITO, AZO, ZnO etc., and conductive organic thin films comprising PEDOT:PSSH, PANi etc.

Preferably, the OLECs are prepared on a flexible substrate. The suitable substrate is preferably selected from films or foils based on polymers or plastics. The selection criterion for polymers or plastics are 1) hygienic property 2) glass transition temperature. The glass temperature (Tg) of the polymers can be found in a suitable handbook, for example in "Polymer Handbook", Eds. J. Brandrup, E. H. Immergut, and E. A. Grulke, John Willey & Sons, Inc., 1999, VI/193-VI/276. Preferably, the Tg of the polymer is above 100° C., very preferably above 150° C., and particularly above 180° C. Very preferred substrates are for example, poly(ethylene terephthalate) (PET) and poly(ethylene 2,6-naphthalate) (PEN)

Preferably the electroluminescent devices according to the present invention emit white light, wherein white light is defined as disclosed above, i.e. white light exhibits a CIE value in the range between (0.2/0.2) to (0.45/0.48), preferably in the range between (0.25/0.25) and (0.4/0.47), very preferably in the range between (0.3/0.3) and (0.4/0.47) and particularly preferably in the range between (0.31/0.31) and (0.4/0.47).

It is further preferred if the organic electroluminescent device exhibits a color rendering index (CRI) of the emitted light that is 55 or higher, preferably 60 or higher, very preferably 65 or higher, particularly preferably 70 or higher, very particularly preferably 75 or higher and even more preferably 77 or higher.

The present invention further relates to the preparation of an organic electroluminescent device according to the present invention by employing a composition as disclosed above, characterized in that at least one layer is either formed by vapor deposition or from solution.

The present invention is distinguished by the following surprising advantages over the prior art:
1. The devices comprising the compositions according to the present invention exhibit white emission with high color purity.
2. The devices according to the present invention exhibit excellent performance data (e.g. high quantum efficacy, short turn on time, high operational life time).
3. Color and CRI of the devices comprising the composition according to the present invention can easily be tailored by one skilled in the art.
4. Color stability of the devices comprising the composition according to the present invention is very high.
5. The devices comprising the composition according to the present invention show broad emission, which is beneficial for the generation of white light.
6. The compositions, formulations and devices according to the present invention can easily be prepared. Costs of goods as well as production costs for the devices are low. Thus, the devices and compositions are suitable for commercial production, even for mass production.

It should be pointed out that variations of the embodiments described in the present invention fall within the scope of this invention. Each feature disclosed in the present invention can, unless explicitly excluded, be replaced by alternative features which serve the same, an equivalent or a similar purpose. Thus, each feature disclosed in the present invention should, unless stated otherwise, be regarded as an example of a generic series or as an equivalent or similar feature.

All features of the present invention can be combined with one another in any way, unless certain features and/or steps are mutually exclusive. This applies, in particular, to preferred features of the present invention. Equally, features of non-essential combinations can be used separately (and not in combination).

It should furthermore be pointed out that many of the features, and in particular those of the preferred embodiments of the present invention, should be regarded as inventive themselves and not merely as part of the embodiments of the present invention. Independent protection may be granted for these features in addition or as an alternative to each invention claimed at present.

The teaching regarding technical action disclosed with the present invention can be abstracted and combined with other examples.

The invention is explained in greater detail by the following examples and drawings without wishing it to be restricted thereby.

FIG. 1 shows electroluminescent emission intensity as a function the wavelength for two different compositions used in OLECs. The device emits white light if the concentration of the phosphorescent red emitter (RE1) is 0.5 wt.-%. The device emits red light if the concentration RE1 is 5 wt.-%

WORKING EXAMPLES

Example 1

Materials and Preparation of Conjugated Polymers
RE1 is a red light emitting phosphorescent small molecule emitter as disclosed in WO 2011/141120 A1

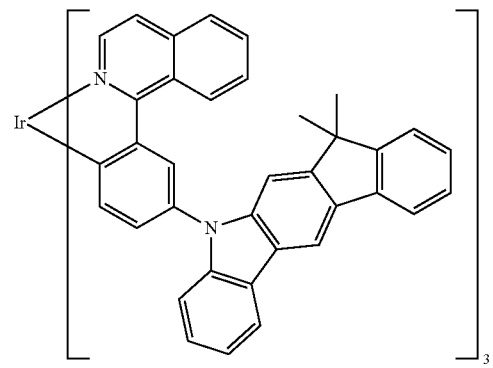

Conjugated Polymer 1 (P1)

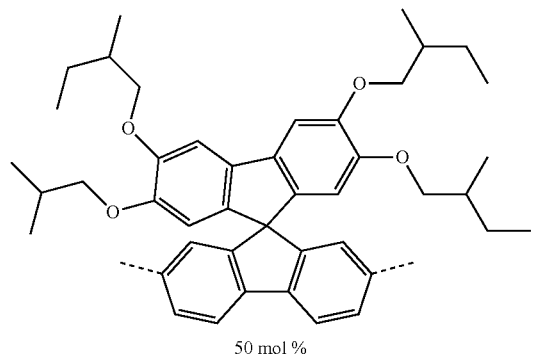

50 mol %

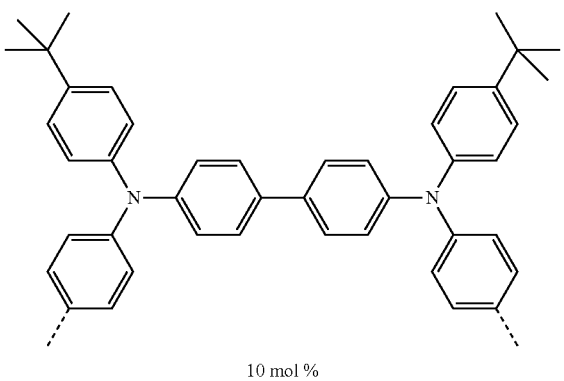

10 mol %

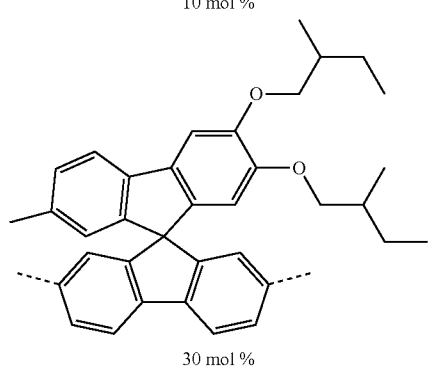

30 mol %

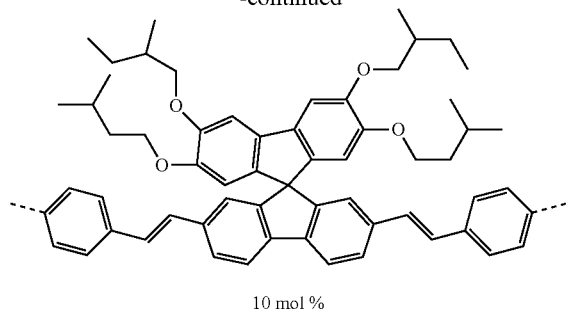

10 mol %

P1 can be prepared according to WO 97/39045, WO 2003/020790, WO 2005/014688 using Suzuki coupling (WO 2003/048225).

Conjugated Polymer 2 (P2)

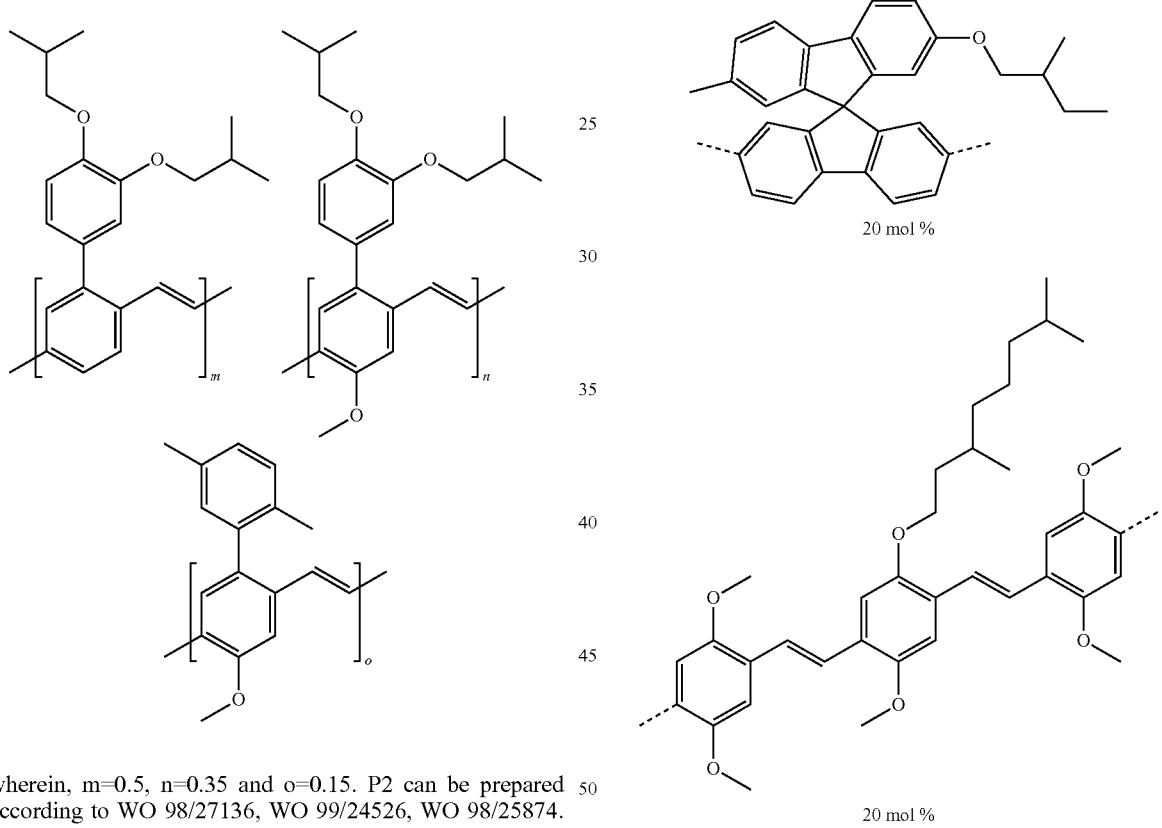

wherein, m=0.5, n=0.35 and o=0.15. P2 can be prepared according to WO 98/27136, WO 99/24526, WO 98/25874.

Conjugated Polymer 3 (P3)

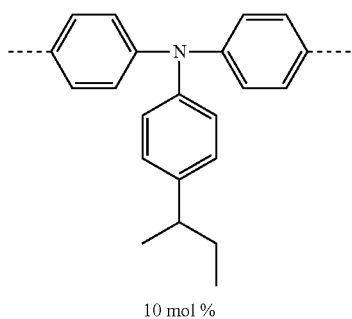

10 mol %

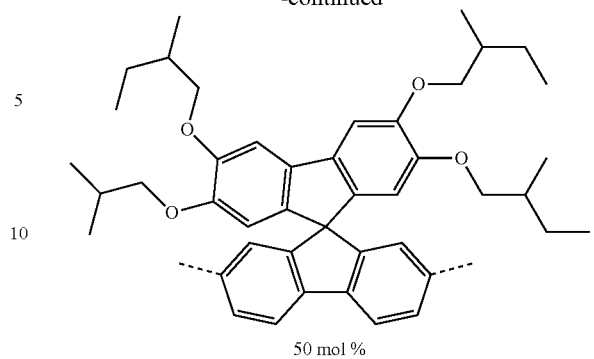

50 mol %

20 mol %

20 mol %

P3 can be prepared according to WO 97/39045, WO 2003/020790, WO 2005/014688 using Suzuki coupling (WO 2003/048225).

The ion-transport material hydroxyl-endcapped trimethylolpropane ethoxylate (TMPE) and the salt $LiCF_3SO_3$ can be purchased from Aldrich (Steinheim, FRG). The salt is dried in a vacuum oven at T=473 K before use.

All materials are dissolved separately in anhydrous tetrahydrofuran at a concentration of 10 mg/ml. The active material solutions are prepared by mixing the master solutions in a volume ratio. The active material solutions are stirred on a magnetic hot plate for 5 h at T=323 K immediately before film fabrication.

Example 2

Preparation of White Light Emitting OLEDs

For the OLED fabrication, poly(3,4-ethylenedioxythiophene)-poly(styrene sulfonate) (PEDOT:PSS, Clevios P VP AI 4083, Heraeus, FRG) is spin coated on top of carefully cleaned indium-tin-oxide (ITO) coated glass substrates (1.5×1.5 cm$^2$, 20 ohms/square, Thin Film Devices, USA) at 4000 rpm for 60 s. The resulting 40 nm thick PEDOT:PSS film is dried at T=120° C. for 6 h. The active material is spin-coated from an active material solution at 2000 rpm for 60 s on top of the PEDOT:PSS layer. The resulting 120 nm thick active material is dried at T=50° C. for >5 h. The Ca cathodes (thickness: 20 nm), with an Al capping layer (thickness: 100 nm), are deposited on top of the active layer by thermal evaporation to complete the OLED structure.

Preparation of OLED1

According to the aforementioned method OLED1 having the following structure is prepared: ITO/PEDOT:PSS/P1:P2 (1.5 wt.-%):RE1 (0.8 wt.-%)/Ca/Al Preparation of OLED2

According to the aforementioned method OLED2 having the following structure is prepared: ITO/PEDOT:PSS/P1:RE1 (0.5 wt.-%)/Ca/Al

Example 3

Preparation of White Light Emitting OLECs

For the OLEC fabrication, poly(3,4-ethylenedioxythiophene)-poly(styrene sulfonate) (PEDOT:PSS, Clevios P VP AI 4083, Heraeus, FRG) is spin coated on top of carefully cleaned indium-tin-oxide (ITO) coated glass substrates (1.5×1.5 cm$^2$, 20 ohms/square, Thin Film Devices, USA) at 4000 rpm for 60 s. The resulting 40 nm thick PEDOT:PSS film is dried at T=120° C. for 6 h. The active material is spin-coated from an active material solution at 2000 rpm for 60 s on top of the PEDOT:PSS layer. The resulting 120 nm thick active material is dried at T=50° C. for ≥5 h. Al cathodes (thickness: 100 nm) are deposited by thermal evaporation at p<2×10$^{-4}$ Pa through a shadow mask to complete the OLEC structure.

Preparation of OLEC1

According to the aforementioned method OLEC1 having the following structure is prepared, wherein the mass ration of P1:P3:P2:RE1 is 100:1:1.5:1: ITO/PEDOT:PSS/P1:P3 (1.0 wt.-%):P2 (1.5 wt.-%):RE1 (1.0 wt.-%):Electrolyte/Al wherein the electrolyte is TMPE (10.0 wt.-%): LiCF$_3$SO$_3$ (3.0 wt.-%) and wherein in this example and in the following examples the weight percent are related to the total mass of the layer.

Preparation of OLEC2

According to the aforementioned method OLEC2 having the following structure is prepared: ITO/PEDOT:PSS/P1:RE1 (0.5 wt.-%):Electrolyte/Al wherein the electrolyte is TMPE (10.0 wt.-%): LiCF$_3$SO$_3$ (3.0 wt.-%)

Preparation of OLEC3

According to the aforementioned method OLEC3 having the following structure is prepared: ITO/PEDOT:PSS/P1:P2 (1.5 wt.-%):RE1 (0.8 wt.-%): Electrolyte/Al wherein the electrolyte is TMPE (10 wt.-%): LiCF$_3$SO$_3$ (3 wt.-%)

Preparation of OLEC4

According to the aforementioned method OLEC4 having the following structure is prepared: ITO/PEDOT:PSS/P1:P3 (1.0 wt.-%):RE1 (0.6 wt.-%):Electrolyte/Al wherein the electrolyte is TMPE (10 wt.-%): LiCF$_3$SO$_3$ (3 wt.-%)

Example 5

Preparation of a Comparative OLEC (cOLEC)

A comparative OLEC (cOLEC) is prepared in analogy to OLEC2, but with 5 wt.-% RE1 instead of 0.5 wt.-% RE1. The result is shown in FIG. 1. cOLEC emits red light, whereas OLEC2 shows white light emission.

Example 6

Characterization of Devices

The devices are driven and measured by a Keithley 2400 source-meter unit. The luminance is measured using a calibrated photodiode equipped with an eye response filter (Hamamatsu Photonics) and connected though a current-to-voltage amplifier to a HP 34401A voltmeter. Electroluminescence (EL) measurements are performed using a calibrated USB2000 fibre optic spectrometer (Ocean Optics). The colour rendering index (CRI), the CIE coordinates, and the correlated colour temperature (CCT) are calculated using the SpectraWin software. The results are shown in Table 1.

TABLE 1

| Device | CIE (x/y) | CRI | CCT (K) | Turn on V (>1 cd/m$^2$)* | Max. CE [cd/A] | Max PE [lm/W] | Lifetime [h] |
|---|---|---|---|---|---|---|---|
| OLED1 | (0.37/0.45) | 79 | 4500 | 3.7 | 2.6 | 1.2 | |
| OLED2 | (0.32/0.33) | 64 | 6000 | 4.4 | 1.6 | 0.64 | |
| OLEC1 | (0.37/0.45) | 79 | 4500 | | 4.3 | 2.8 | 12 |
| OLEC2 | (0.33/0.36) | 66 | 4800 | | 3.6 | 1.5 | 10 |
| OLEC3 | (0.37/0.45) | 77 | 4000 | | 4.1 | 1.7 | 10 |
| OLEC4 | (0.39/0.46) | 58 | 3500 | | 2.9 | 1.2 | 8 |

CE: current efficacy;
PE: power efficacy

As clearly shown in Table 1 mixtures of conjugated polymers and of a phosphorescent small molecule result in devices with excellent CRIs. Compositions comprising only one conjugated polymer and a phosphorescent small molecule result in devices having almost perfect white emission (0.33/0.33).

The invention claimed is:

1. Composition comprising a first conjugated polymer and at least one phosphorescent small molecule emitter, having a peak photoluminescent emission wavelengths $\lambda_{phos}^{PL}$ and $\lambda_{cP1}^{PL}$, respectively, wherein the concentration of the phosphorescent small molecule emitter is below 4 wt.-% with respect to the total mass of the composition, further comprising a second conjugated polymer having a peak photoluminescent emission wavelength $\lambda_{cP2}^{PL}$, and that is different from the first conjugated polymer, and wherein the second conjugated polymer emits yellow light.

2. Composition according to claim 1, wherein the first and the second conjugated polymers are fluorescent polymers.

3. Composition according to claim 1, wherein $\lambda_{phos}^{PL} > \lambda_{cP1}^{PL}$, wherein $\lambda_{phos}^{PL}$ and $\lambda_{cP1}^{PL}$ are the peak photoluminescent emission wavelengths of the phosphorescent small molecule emitter and the first conjugated polymer, respectively.

4. Composition according to claim 1, wherein $\lambda_{phos}^{PL} > \lambda_{cP2}^{PL}$, $\lambda_{phos}^{PL} > \lambda_{cP1}^{PL}$, and $\lambda_{cP1}^{PL} \neq \lambda_{cP2}^{PL}$, wherein $\lambda_{phos}^{PL}$, $\lambda_{cP2}^{PL}$ and $\lambda_{cP1}^{PL}$ are the peak photoluminescent emission wavelengths of the phosphorescent small molecule emitter, the second conjugated polymer and the first conjugated polymer, respectively.

5. Composition according to claim 3, wherein 570 nm<$\lambda_{phos}^{PL}$<700 nm.

6. Composition according to claim 3, wherein the $\lambda_{phos}^{PL}$ and $\lambda_{cP12}^{PL}$ represent complementary colors, wherein $\lambda_{cP12}^{PL}$ is defined by the peak photoluminescent emission wavelength of a composition of the first conjugated polymer and the second conjugated polymer.

7. Composition according to claim 6, wherein 490 nm<$\lambda_{cP12}^{PL}$<580 nm.

8. Composition according to claim 6, wherein 380 nm<$\lambda_{cP12}^{PL}$<550 nm.

9. Composition according claim 1, wherein the first conjugated polymer emits blue light.

10. Composition accordingly to claim 1, wherein the first and second conjugated polymers are selected from arylamines, heteroarylamines, spirobifluorenes, fluorenes or polyarylvinylenes.

11. Composition according to claim 1, wherein the phosphorescent emitter is a transition metal complex comprising a transition metal selected from the group consisting of iridium, rhodium, ruthenium, osmium, platinum, and palladium.

12. Composition according to claim 1, wherein the phosphorescent small molecule emitter is present at a concentration of less than 2 wt.-%, with respect to the total mass of the composition.

13. Composition according to claim 1, further comprising a host that is another conjugated polymer.

14. Composition according to claim 1, further comprising an electrolyte.

15. Formulation comprising at least one composition according to claim 1 and at least one solvent.

16. Organic electroluminescent device comprising at least one composition according to claim 1, wherein the device emits white light.

17. Device according to claim 16, wherein the device is an organic light emitting diode (OLED).

18. Organic light emitting electrochemical cell (OLEC, LEEC, LEC) comprising at least one composition according to claim 1.

19. Device according to claim 16, wherein the emitted white light exhibits a CIE coordinate in a range between (0.25/0.25) and (0.4/0.47).

20. Device according to claim 19, wherein the emitted white light includes a color rendering index (CRI) of or above.

21. Process for the preparation of a device according to claim 16, wherein at least one layer is either formed by vapor deposition or from solution.

22. Composition comprising a first conjugated polymer and at least one phosphorescent small molecule emitter, having a peak photoluminescent emission wavelengths $\lambda_{phos}^{PL}$ and $\lambda_{cP1}^{PL}$, respectively, wherein the concentration of the phosphorescent small molecule emitter is below 4 wt.-% with respect to the total mass of the composition, further comprising a second conjugated polymer having a peak photoluminescent emission wavelength $\lambda_{cP2}^{PL}$, and that is different from the first conjugated polymer, further comprising a host that is another conjugated polymer.

23. Composition according to claim 22, wherein the second conjugated polymer emits green light.

24. Composition comprising a first conjugated polymer and at least one phosphorescent small molecule emitter, having a peak photoluminescent emission wavelengths $\lambda_{phos}^{PL}$ and $\lambda_{cP1}^{PL}$, respectively, wherein the concentration of the phosphorescent small molecule emitter is below 4 wt.-% with respect to the total mass of the composition, further comprising a second conjugated polymer having a peak photoluminescent emission wavelength $\lambda_{cP2}^{PL}$, and that is different from the first conjugated polymer, further comprising an electrolyte.

25. Organic light emitting electrochemical cell (OLEC, LEEC, LEC) comprising at least one composition comprising a first conjugated polymer and at least one phosphorescent small molecule emitter, having a peak photoluminescent emission wavelengths $\lambda_{phos}^{PL}$ and $\lambda_{cP1}^{PL}$, respectively, wherein the concentration of the phosphorescent small molecule emitter is below 4 wt.-% with respect to the total mass of the composition, further comprising a second conjugated polymer having a peak photoluminescent emission wavelength $\lambda_{cP2}^{PL}$, and that is different from the first conjugated polymer.

* * * * *